United States Patent
Lim et al.

(10) Patent No.: US 8,161,439 B2
(45) Date of Patent: Apr. 17, 2012

(54) METHOD AND APPARATUS FOR PROCESSING ASSERTIONS IN ASSERTION-BASED VERIFICATION OF A LOGIC DESIGN

(75) Inventors: Amy Lim, Sunnyvale, CA (US); Ping-sheng Tseng, Saratoga, CA (US); Yogesh Goel, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 968 days.

(21) Appl. No.: 12/028,909

(22) Filed: Feb. 11, 2008

(65) Prior Publication Data

US 2009/0204931 A1 Aug. 13, 2009

(51) Int. Cl.
*G06F 17/50* (2006.01)
(52) U.S. Cl. ...................................................... 716/106
(58) Field of Classification Search .................. 716/106, 716/107, 136
See application file for complete search history.

(56) References Cited

U.S. PATENT DOCUMENTS

| 7,143,373 B2 | 11/2006 | Moorby | |
|---|---|---|---|
| 7,257,802 B2 * | 8/2007 | Daw et al. | 716/104 |
| 7,536,662 B2 * | 5/2009 | Sarwary et al. | 716/106 |
| 2007/0083548 A1 * | 4/2007 | Li et al. | 707/102 |

* cited by examiner

*Primary Examiner* — Vuthe Siek
*Assistant Examiner* — Aric Lin
(74) *Attorney, Agent, or Firm* — Holland & Knight LLP; Brian J. Colandreo, Esq.; Mark H. Whittenberger, Esq.

(57) ABSTRACT

Method and apparatus for processing assertions in assertion-based verification of a logic design are described. One example relates to processing an assertion during verification of a logic design. An evaluation engine is generated that encodes, using a non-deterministic finite automata (NFA) model, temporal behavior of the logic design required by the assertion for a single attempt to evaluate the assertion. The evaluation engine is implemented in first reconfigurable hardware. The logic design is simulated over a plurality of clock events. Attempts to evaluate the assertion by the evaluation engine are preformed sequentially based on input stimuli obtained from the logic design during simulation thereof. Each of the attempts results in one of the assertion passing, the assertion failing, or the assertion requiring further evaluation.

20 Claims, 4 Drawing Sheets

| CLOCKING EVENTS (602) | NEW ATTEMPT (604) | VALUES (606) | | | ACTIONS (608) | | FIFO TOKEN (S1, S2) (610) | |
|---|---|---|---|---|---|---|---|---|
| | | a | b | c | PASS | FAIL | EXTRACTED | SAVED |
| 1 | YES | 1 | 0 | 0 | | | | (1, 0) |
| 2 | NO | 1 | 1 | 0 | | | (1, 0) | (1, 1) |
| 3 | YES | 1 | 0 | 1 | 1 | | (1, 1) | (1, 0) |
| 4 | YES | 1 | 1 | 1 | | | (1, 0) | (1, 1) (1, 0) |
| 5 | NO | 0 | 0 | 0 | | 1 | (1, 1) (1, 0) | |

600    FIG. 6

METHOD AND APPARATUS FOR PROCESSING ASSERTIONS IN ASSERTION-BASED VERIFICATION OF A LOGIC DESIGN

BACKGROUND OF THE INVENTION

1. Field of the Invention

Embodiments of the invention generally relate to electronic design automation and, more specifically, to a method and apparatus for processing assertions in assertion-based verification of a logic design.

2. Description of the Related Art

In electronic design automation (EDA), functional verification is the task of verifying that a logic design conforms to its specification. Logic simulation is the process of simulating a logic design before the logic design manufactured as integrated circuits (ICs). Logic designs may be described using various languages, such as hardware description languages (HDLs) or other more abstract languages (e.g., synthesizable SystemC). In simulation, engineers write a test-bench program to functionally verify the logic design by providing meaningful scenarios to check that, given certain input stimuli, the design performs to specification. A test-bench may be written using various languages, including lower-level languages, such as very high speed integrated circuit HDL (VHDL), Verilog, and the like, as well as more abstract languages, such as C/C++, SystemC, SystemVerilog, and the like.

In software simulation, a description of the logic design is simulated on computers or workstations. Pure software simulation, however, decreases in performance as the logic design becomes larger and more complex. Simulation acceleration addresses the performance shortcomings of pure software simulation. In simulation acceleration, the logic design is mapped into a hardware accelerator to provide a design under verification (DUV), which allows the design to run much faster than on a general-purpose computer or workstation. The test-bench continues to run using a software simulator on a computer or workstation. A communication channel connects the software simulator and the hardware accelerator to exchange data between the test-bench and design.

A recent design verification method, known as assertion-based verification, involves testing a simulation of the circuit against one or more assertions describing how the circuit should behave. An "assertion" is a statement that a certain property must be true, for example, that a first asserted signal must always be followed by a second asserted signal within two clock cycles. Assertions allow for automated checking that the specified property is true, and can generate automatic error messages if the property is not true. Industry organizations have defined standardized assertion languages that designers can use to specify their assertions.

Assertion languages often support two kinds of assertions: concurrent and immediate. Immediate assertions, sometimes also called combinational assertions, follow simulation event semantics for their execution and are executed like a statement in a procedural block. Concurrent assertions, on the other hand, are temporal in nature and are based on clock semantics and use time-sampled values of variables. Concurrent assertions are sometimes also called sequential assertions.

In a simulation verification environment, assertions are validated continuously during simulation to ensure expected design behavior. To prevent degradation of performance in a hardware-based accelerator system, it is as important to accelerate assertion checking as to accelerate the logic design being simulated. One known technique for assertion acceleration involves use of a static, synthesizable model that can represent any snapshot of simultaneously active assertion match attempts during simulation. Targeting the different possible scenarios of an assertion (i.e., the remaining criteria for a successful match), the technique constructs a deterministic finite automata (DFA) model, where each possible scenario of the assertion is explicitly encoded as a distinct state in the DFA.

The DFA technique has two fundamental drawbacks that limit its applicability. First, the DFA technique must explicitly encode all possible scenarios to capture any snapshot, including the one where all possible scenarios occur simultaneously even though it might not be the case in a particular simulation run. As a result, the numbers of DFA states and state transitions typically increase non-linearly and explode exponentially. Second, the DFA approach is a flattened snapshot solution. It can capture the scenarios of all ongoing match attempts, but cannot distinguish between different attempts that transition into the same DFA state. This coalescing of match attempts makes it unnatural for the DFA approach to maintain separate local environments for different attempts. As such, it is typically infeasible for the DFA approach to support "attempt-sensitive" controls as defined in some assertion languages, such as the System Verilog assertion language.

Accordingly, there exists a need in the art for an improved method and apparatus for processing assertions in assertion-based verification of a logic design.

SUMMARY OF THE INVENTION

One aspect of the invention relates to a method of processing an assertion during verification of a logic design. An evaluation engine is generated that encodes, using a non-deterministic finite automata (NFA) model, temporal behavior of the logic design required by the assertion for a single attempt to evaluate the assertion. The evaluation engine is implemented in first reconfigurable hardware. The logic design is simulated over a plurality of clock events. Attempts to evaluate the assertion by the evaluation engine are performed sequentially based on input stimuli obtained from the logic design during simulation thereof. Each of the attempts results in one of the assertion passing, the assertion failing, or the assertion requiring further evaluation.

Another aspect of the invention relates to an apparatus for processing an assertion during verification of a logic design. An evaluation engine encodes, using a non-deterministic finite automata (NFA) model, temporal behavior of the logic design required by the assertion for a single attempt to evaluate the assertion. A first-in-first-out (FIFO) memory is in communication with the evaluation engine. The FIFO memory is configured to store information indicative of active attempts to evaluate the assertion by the evaluation engine during simulation of the logic design over a plurality of clock events.

Another aspect of the invention relates to a system for verification of a logic design. A workstation is configured to execute a verification platform that controls simulation of the logic design. The verification platform defines an assertion that represents temporal behavior of the logic design. A hardware accelerator is in communication with the workstation. The hardware accelerator includes first reconfigurable hardware for implementing the logic design and second reconfigurable hardware for implementing an assertion matching machine. The assertion evaluation machine includes: an evaluation engine that encodes, using a non-deterministic finite automata (NFA) model, a single attempt to evaluate the assertion; and a FIFO memory in communication with the evaluation engine. The FIFO memory is configured to store information indicative of active attempts to evaluate the assertion by the evaluation engine during the simulation of the logic design over a plurality of clock events.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6 depicts a table showing an exemplary evaluation sequence for the exemplary assertion of FIG. 3.

DETAILED DESCRIPTION

Figure 1:
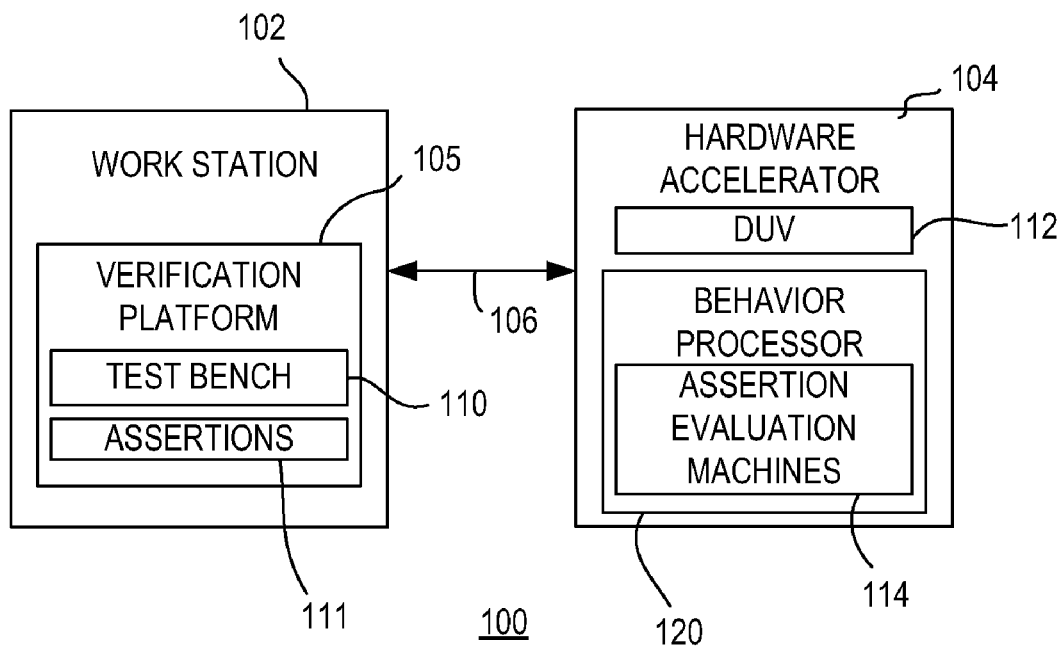
FIG. 1 is a block diagram depicting an exemplary embodiment of a logic design verification system in accordance with one or more aspects of the invention.

FIG. 1 is a block diagram depicting an exemplary embodiment of a logic design verification system 100 in accordance with one or more aspects of the invention. The system 100 includes a workstation 102 coupled to a hardware accelerator 104 via a communication link 106. The workstation 102 may comprise any type of general-purpose or specific-purpose computer. An exemplary computer is shown below in FIG. 7. The hardware accelerator 104 may comprise any type of acceleration or acceleration/emulation platform. For example, the hardware accelerator 104 may comprise an XTREME series accelerator/emulator commercially available from Cadence Design Systems, Inc. of San Jose, Calif. For example, the hardware accelerator 104 may include one or more programmable logic devices (PLDs), such as field programmable gate arrays (FPGAs). The communication link 106 comprises any type of high-speed bus for the transfer of signals between the workstation 102 and the hardware accelerator 104.

The hardware accelerator 104 is configured with a design under verification (DUV) 112. The DUV 112 is specified using a synthesizable language (e.g., an HDL or synthesizable SystemC, System Verilog, etc.) and are compiled into a form suitable for execution by the hardware accelerator 104. For example, the DUV 112 may be implemented using reconfigurable hardware of the hardware accelerator 105, such as configuration in one or more PLDs. The workstation 102 is loaded with a verification platform 105. The verification platform 105 may be used to configure the hardware accelerator 104 with the DUV 112. In addition, the verification platform 105 may be used to establish or otherwise obtain a test bench 110. The test bench 110 is configured to perform tests on the DUV 112 for functionally verifying the logic design of the DUV 112. The test bench 110 may be written using a programming language, such as C/C++, SystemC, System Verilog, and the like, and is compiled for execution by a simulator 108. The test bench 110 may comprise various test algorithms and routines for functional verification. The verification platform 105 may further include assertions 111 that can be used to test functionality of the DUV 112.

The assertions 111 may be written in any assertion language. Typically, the assertions 111 are written in a language compatible with the language that specifies the DUV 112 and/or the test bench 110. For example, if the DUV 112 and/or test bench 110 may be written using System Verilog and the assertions 111 may be written using the assertion semantics of System Verilog. For purposes of clarity by example, the assertions 111 are described below in accordance with System Verilog semantics. It is to be understood that the assertions 111 may be written using other semantics of other assertion languages.

An assertion comprises an expression that can be evaluated to determine certain temporal behavior of the DUV 112. For example, an assertion expression may describe a temporal sequence of signals of the DUV 112 the occurrence of which causes the assertion to be evaluated as true. An assertion expression may include a plurality of sub-expressions. An assertion expression or sub-expression is written in terms of signals of the DUV 112 related by operators. The signals can represent outputs of the DUV 112, inputs to the DUV 112, or signals internal to the DUV 112. Exemplary assertions written in System Verilog assertion semantics are described below.

The evaluation model for the assertions 111 is based on a clock such that a given assertion is evaluated at the occurrence of a clock event (also referred to herein as a clock tick). The values of signals used in an evaluation are sampled values from the DUV 112. The definition of the clock may be specified by the user and can vary from one assertion to another. A clock tick is considered an atomic moment of zero duration that occurs only once at a simulation time. The sampled values for that simulation time are the signal values used for evaluation. A simulation run executed by the system 100 covers a range of clock ticks referred to as a simulation period.

The hardware accelerator 104 may be further configured with a behavior processor 120 for processing the assertions 111 during a simulation run. The behavior processor 120 may be implemented using reconfigurable hardware of the hardware accelerator 105, such as configuration in one or more PLDs. The verification platform 105 may be configured to compile or otherwise process the assertions 111 to generate one or more assertion evaluation machines 114, which are implemented by the behavior processor 120. For example, each assertion may include a corresponding assertion evaluation machine 114 in the behavior processor 120. Each assertion evaluation machine 114 is configured to follow along, clock tick by clock tick, with the execution of the simulation in order to perform attempts to evaluate an assertion. The behavior processor 120 is configured for communication with the DUV 112 to obtain input stimuli for the assertion evaluation machines 114 for such evaluation of the assertions 111. A given input stimulus to a given assertion evaluation machine 114 may include values of the signals specified by the implemented assertion for a particular clock tick. Each assertion evaluation machine 114 is configured to perform one or more attempts to evaluate an assertion based on a sequence of input stimuli from the DUV 112 over a plurality of clock ticks. Each assertion evaluation machine 114 may report that its corresponding assertion has ultimately passed, failed, or produced an indeterminate result for each attempt. Note that an assertion may produce multiple pass and/or fail indicators.

Figure 2:
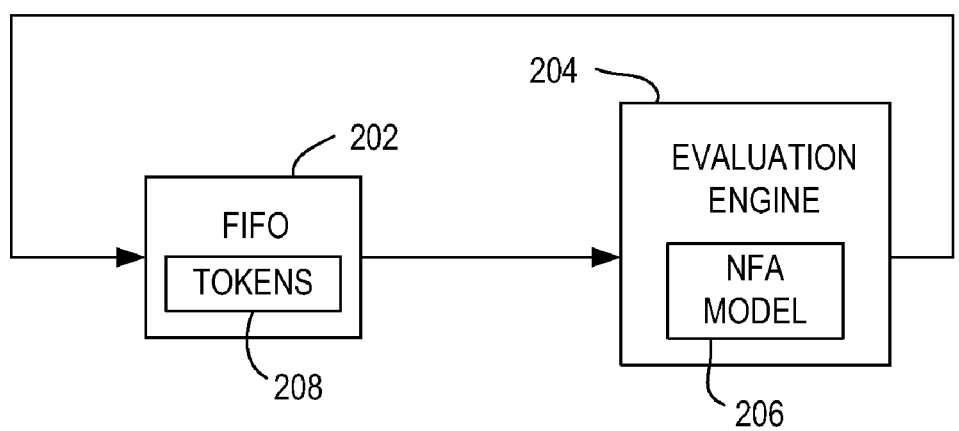
FIG. 2 is a block diagram depicting an exemplary embodiment of an assertion evaluation machine in accordance with one or more aspects of the invention.

FIG. 2 is a block diagram depicting an exemplary embodiment of an assertion evaluation machine 114 in accordance with one or more aspects of the invention. The assertion evaluation machine 114 includes a first-in-first-out buffer (FIFO) 202 and an evaluation engine 204. An input of the evaluation engine 204 is coupled to an output of the FIFO 202. An output of the evaluation engine 204 is coupled to an input of the FIFO 202. The evaluation engine 204 uses a non-deterministic finite automata (NFA) model 206 to encode the temporal behavior of an assertion for a single evaluation attempt. The FIFO 202 is configured to store information related to active attempts. Notably, individual active attempts are stored as tokens 208 in the FIFO 202. At each clock tick, any newly activated attempt and all tokens from previous clock ticks are processed sequentially by the evaluation engine 204 based on an input stimulus from the DUV 112.

For example, consider an assertion A1 having an expression defined as follows (in terms of System Verilog semantics): "a[*1:$]##1 b ##1 c", where "a", "b", and "c" are signals of the DUV 112. The assertion A1 includes three sub-expressions representing three different signal sequences of the DUV 112, namely, the sub-expression "a[*1:$]", the sub-expression "b", and the sub-expression "c". As is known in the art, the operator "##N" specifies that a second signal sequence must follow a first sequence beginning N clock ticks after the first sequence completes. The operator "##N" is known both as a cycle delay operator and a concatenation operator. The syntax "[*min:max]" denotes a consecutive repetition with a range of min to max numbers of times. The "$" specifies a potentially infinite number of repetitions. Thus, the assertion A1 specifies that the signal "a" be true on every consecutive clock tick until the signal "b" is true, and then the signal "c" be true one clock tick after the signal "b" is true. For example, the assertion A1 passes if signal "a" is true for five clock ticks, followed by the signal "b" being true on the sixth clock tick, followed by the signal "c" being true on the seventh clock tick.

Figure 3:
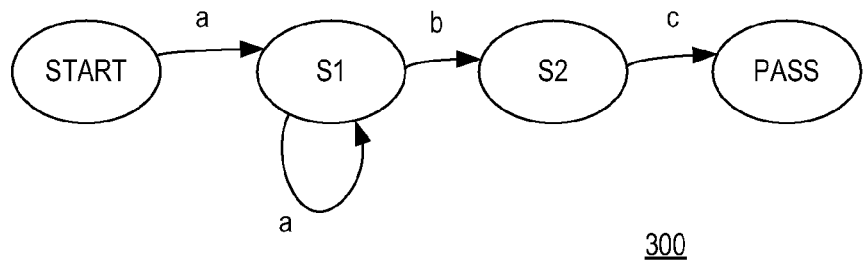
FIG. 3 is a block diagram depicting an exemplary embodiment of a model encoding an exemplary assertion in accordance with one or more aspects of the invention.

FIG. 3 is a block diagram depicting an exemplary embodiment of a model 300 encoding the assertion A1 in accordance with one or more aspects of the invention. The model 300 is an example of the NFA model 206 in the evaluation engine 204. The model 300 includes four states designated as "start", "S1", "S2", and "Pass". The states may be represented by a 4-bit state vector (start, S1, S2, pass), where a "0" means the state is inactive (not transitioned to) and a "1" means the state is active (transitioned to). The model 300 is an NFA that encodes any single attempt to evaluate the assertion A1 (as used herein for clarity, the term "attempt" refers to "an attempt to evaluate an assertion"). When a new attempt is initiated, the model 300 transitions to the state "start", i.e., a scenario where the state "start" is active, yielding a state vector (1, 0, 0, 0). For an input stimulus from first clock tick, if the signal "a" is active (e.g., a logic "1"), then the model 300 transitions to the state "S1". That is, the model 300 exhibits a scenario where the "S1" is active, yielding a state vector (0, 1, 0, 0). If the signal "a" in the input stimulus from the first clock tick is inactive (e.g., logic "0"), then the model 300 exhibits a scenario where all states are inactive, i.e., a state vector (0, 0, 0, 0). Note that the model 300 does not include an explicit fail state. Failure is detected when all states are inactive, i.e., the state vector is (0, 0, 0, 0).

Assume the state vector is now (0, 1, 0, 0). If only the signal "a" in an input stimulus from the next clock tick is active, the model 300 stays in the state "S1", i.e., the state vector remains unchanged. However, if only the signal "b" in the input stimulus from the next clock tick is active, then the model 300 transitions to the state "S2", i.e., the state vector becomes (0, 0, 1, 0). If both signals "a" and "b" are active, the model 300 exhibits a scenario where both "S1" and "S2" are active, i.e., a state vector (0, 1, 1, 0). Finally, if both signals "a" and "b" are inactive, the model 300 exhibits a scenario where all states are inactive, i.e., a state vector (0, 0, 0, 0).

Assume the state vector is now (0, 0, 1, 0) or (0, 1, 1, 0). If the signal "c" in an input stimulus from a next clock tick is active, the model 300 transitions to the state "pass", i.e., the state vector becomes (0, 0, 0, 1). If the signal "c" is inactive, the model 300 exhibits a scenario where all states are inactive, i.e., a state vector (0, 0, 0, 0).

Assume the state vector is now (0, 0, 1, 0). If only the signals "b" and "c" in an input stimulus from a next clock tick are active, the model 300 transitions to the states "S2" and "pass", i.e., the state vector becomes (0, 0, 1, 1). Since the updated state vector contains the "pass" state, the attempt is evaluated to pass. If all the signals "a", "b", and "c" are inactive, the model 300 exhibits the scenario where all states are inactive, i.e., the state vector (0, 0, 0, 0).

In the model 300 for the assertion A1, any ongoing attempt that has not failed or passed (i.e., an active attempt) can only be in states S1 and/or S2. Thus, the pair of states (S1, S2) is the natural representation of any active attempt that requires further assertion checking in subsequent clock ticks. Thus, the states (S1, S2) may comprise at least a portion of a token for storage in the FIFO 202.

Figure 4:
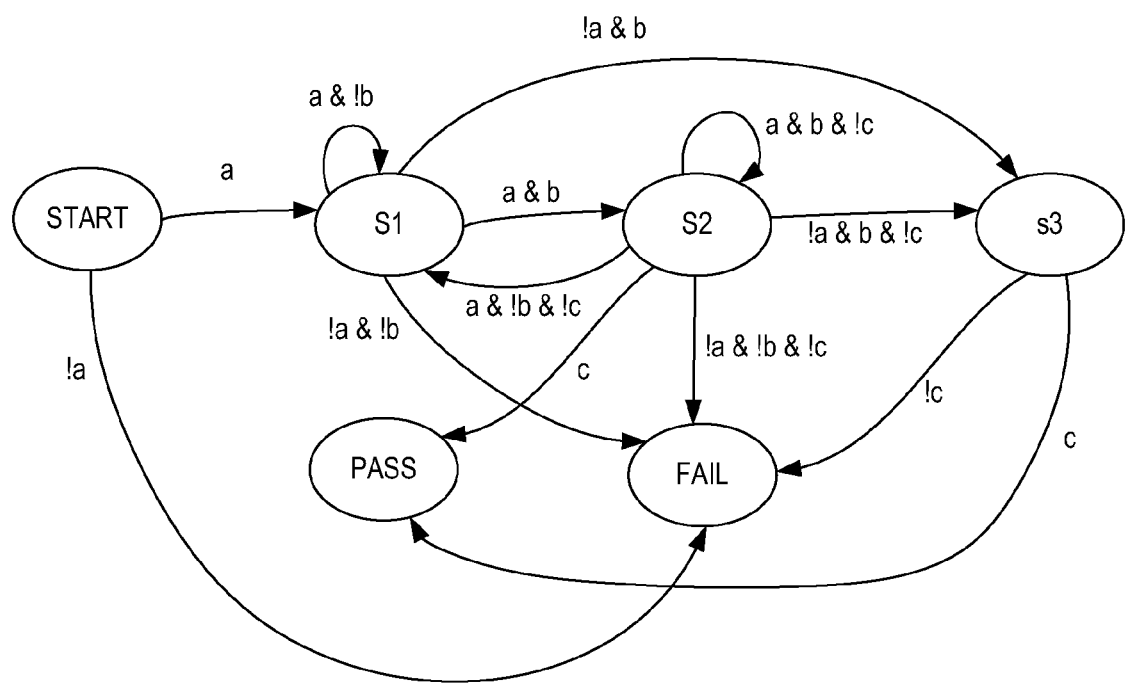
FIG. 4 is a block diagram depicting an exemplary embodiment of a DFA model for the exemplary assertion of FIG. 3.

FIG. 4 is a block diagram depicting an exemplary embodiment of a DFA model 400 for the assertion A1 described above. The DFA model 400 includes six states designated as "start", "S1", "S2", "S3", "pass", and "fail". The model 400 includes the following transitions: 1) a transition from "start" to "S1" if "a" is true; 2) remain in "S1" if "a" is true and "b" is false; 3) transition from "S1" to "fail" if "a" is false and "b" is false; 4) transition from "S1" to "S2" if "a" is true and "b" is true; 5) transition from "S1" to "S3" if "a" is false and "b" is true; 6) transition from "S2" to "S1" if "a" is true, "b" is false, and "c" is false; 7) transition from "S2" to "fail" if all of "a", "b", and "c" are false; 8) transition from "S2" to "pass" if "c" is true; 9) remain in "S2" if "a" and "b" are true and "c" is false; 10) transition from "S2" to "S3" if "a" and "c" are false and "b" is true; 11) transition from "S3" to "fail" if "c" is false; 12) transition from "S3" to "pass" if "c" is true; and 13) transition from "start" to "fail" if "a" is false.

For hardware-based assertion verification to be effective, it should be general in scope, flexible in hardware resource utilization, and efficient in performance. In the area of scope, the NFA model is general and can support many assertion constructs beyond the scope of the DFA model. In particular, the DFA model cannot keep track of distinct local environments from different match attempts, making the DFA model infeasible to support advanced assertion controls, such as local variables. In comparison, the assertion evaluation machine 114 implementing the NFA model 206 stores each active attempt as a separate token in the FIFO 202. Thus, in some embodiments, the assertion evaluation machine 114 can include any local environment or context with the token (e.g., values of local variables).

In the area of hardware utilization, the DFA model must explicitly encode all combinations of active attempts. The NFA model need only capture information for a single attempt. Less information translates to less complex hardware, resulting in the use of less hardware resources in the hardware accelerator 104. Compared to the worst-case DFA solution that can lead to exponential state explosion for complex assertions, the assertion evaluation machine 114 uses a FIFO for dynamic expansion and a much smaller NFA model 206.

The following table shows the size of the DFA model versus the NFA model of the assertion evaluation machine 114 for four exemplary assertions.

|    |                                                                      | NFA Model |        |             | DFA Model |             |
|----|----------------------------------------------------------------------|-----------|--------|-------------|-----------|-------------|
|    |                                                                      | Tokens    | States | Transitions | States    | Transitions |
| A1 | a[*1:$] ##1 b ##1 c                                                  | 2         | 4      | 4           | 6         | 13          |
| A2 | a[*1:$] ##1 b ##1 c ##1 d                                            | 3         | 5      | 5           | 10        | 35          |
| A3 | a[*1:$] ##1 b ##1 c ##1 d ##1 e                                      | 4         | 6      | 6           | 18        | 99          |
| A4 | (a[*1:3] ##1 b[*1:3] ##1 c) or (d[*0:$] ##1 e[*5] ##1 f) or (g[=1] ##0 h)) | 14        | 16     | 28          | 364       | 3350        |

As the data shows, the size of the NFA model is always smaller than the DFA model. When comparing assertion A1 with A2, the DFA model almost doubles in the number of states and triples in the number of transitions. In contrast, the NFA model increases only by one state and one transition, showing a much more reasonable growth in size. The assertion evaluation machine 114 does require hardware utilization in the form of fetching and storing tokens from/to the FIFO. However, for complex assertions that cause DFA state explosion, such as the assertion A4 in the table above, the reduction in hardware logic for the NFA model outweighs any overhead associated with the FIFO in the assertion evaluation machine 114.

In the area of performance, for assertions that cannot be handled by the all-or-nothing DFA approach, the attempt-based approach of the assertion evaluation machine 114 provides the better acceleration performance. When hardware resources are limited, the DFA approach can become impractical or perhaps impossible to use for complex assertions. Instead of allocating hardware resources to cover the worst-case snapshot scenario as the DFA model, the attempt-based approach of the assertion evaluation machine 114 trades off space with time, or hardware resources with performance in behavioral cycles.

Figure 5:
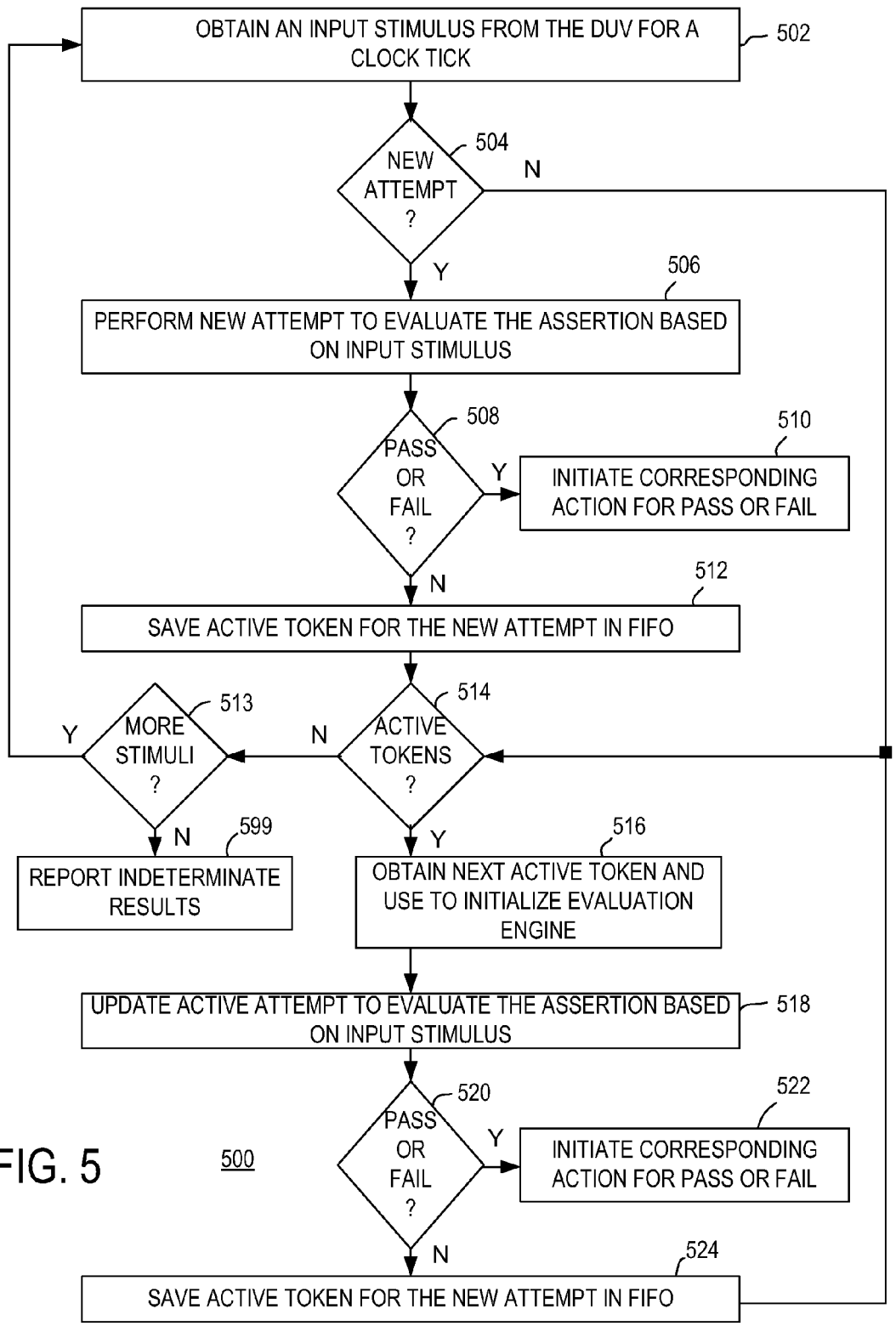
FIG. 5 is a flow diagram depicting an exemplary embodiment of a method for processing an assertion in assertion-based verification in accordance with one or more aspects of the invention.

FIG. 5 is a flow diagram depicting an exemplary embodiment of a method 500 for processing an assertion in assertion-based verification in accordance with one or more aspects of the invention. The method 500 may be executed by the assertion evaluation machine 114 as set forth in the embodiment of FIG. 2. The method 500 begins at block 502, wherein an input stimulus is obtained from the DUV 112 for a clock tick. At block 504, a determination is made whether a new attempt to evaluate the assertion is initiated. In some embodiments, a new attempt may be initiated for each clock tick. In other embodiments, a new attempt may be initiated at fewer than every clock tick (e.g., every second or third clock tick). In yet other embodiments, a new attempt may be initiated at one or more specific clock ticks as pre-defined by the user.

If at block 504 a new attempt is initiated, the method 500 proceeds to block 506; otherwise the method 500 proceeds to block 514. At block 506, the new attempt to evaluate the assertion based on the input stimulus is performed. Depending on the input stimulus, the new attempt can be evaluated to pass, fail, or active. For example, in the model 300, a new attempt cannot be passed, as further clock ticks need to be evaluated for the assertion A1. A new attempt can be failed if the evaluation engine 204 exhibits the state vector (0, 0, 0, 0) (i.e., the signal "a" is false). The new attempt may be evaluated to active if the evaluation engine 204 exhibits the state vector (0, 1, 0, 0) (i.e., the signal "a" is true). In such case, a token can be derived from the state of the evaluation engine 204. For example, the token may comprise (S1, S2) and may have a value of (1, 0) for this new attempt.

The method 500 proceeds from block 506 to block 508, where a determination is made whether the token was evaluated to pass or fail. If so, the method 500 proceeds to block 510; otherwise the method proceeds to block 512. At block 510, a corresponding action for pass or fail of the assertion is initiated. For example, a notification that the assertion passed or failed may be provided as output of the assertion matching machine. At block 512, the updated token from the new attempt is saved in the FIFO of the assertion matching machine.

The method 500 proceeds from block 512 to block 514, where a determination is made whether the assertion matching machine includes any active tokens (i.e., tokens from previous clock ticks, excluding tokens that are saved in the current iteration). If not, the method 500 proceeds to block 513, where a determination is made whether there is another input stimulus for another clock tick. If so, the method 500 returns to block 502, where another input stimulus is obtained for another clock tick. Otherwise, the method 500 ends at block 599, where any active tokens are designated as producing indeterminate results.

If there is an active token at block 514, the method 500 proceeds from block 514 to block 516. At block 516, the next active token is obtained from the FIFO 202 and used to initialize the evaluation engine 204.

At block 518, the active attempt to evaluate the assertion based on the input stimulus is updated. Depending on the input stimulus, the active attempt can be evaluated to pass, fail, or remain active. For example, in the model 300, the active attempt is evaluated to pass if the evaluation engine 204 exhibits any state vector containing the state "pass", e.g., the state vectors (0, 0, 0, 1), (0, 1, 0, 1), (0, 1, 1, 1), etc. The active attempt can be failed if the evaluation engine 204 exhibits the state vector (0, 0, 0, 0). The active attempt may be updated from one active state to another, e.g., from (1, 0) to (1, 1) or (0, 1) based on the evaluation of the input stimulus.

The method 500 proceeds from block 518 to block 520, where a determination is made whether the token was evaluated to pass or fail. If so, the method 500 proceeds to block 522; otherwise the method proceeds to block 524. At block 522, a corresponding action for pass or fail of the assertion is initiated. For example, a notification of that the assertion passed or failed may be provided as output of the assertion matching machine. At block 524, the token for the active attempt is saved in the FIFO of the assertion matching machine. The method 500 returns from block 524 to block 514.

Accordingly, in the assertion evaluation machine 114, individual active evaluation attempts retain their separate identities and are stored as tokens in the FIFO 202. At each clock tick, any new attempt and all FIFO tokens from previous clock ticks are processed one at a time in the evaluation engine 204. In addition to transforming each token to its next state, the evaluation engine 204 can also be customized to perform optimizations, such as coalescing identical tokens if necessary. While an NFA-based model is statically created for a particular assertion, the number of FIFO tokens increases/decreases dynamically according to the input stimuli.

The method 500 may be understood with reference to the following example based on the model 300 described above for the assertion A1. As described above in the method 500, active attempt tokens are evaluated using the evaluation engine 204 of the assertion evaluation machine 114 during simulation. At each clock tick, two general blocks are performed: First, if a new attempt is initiated, the state vector (1, 0, 0, 0) representing the new attempt would be processed first.

FIG. 6 depicts a table 600 showing an exemplary evaluation sequence for the assertion A1. The table 600 includes columns 602 through 610, where the column 602 represents a clock tick, the column 604 represents whether a new attempt is initiated, the column 606 represents an input stimulus, the column 608 represents actions taken, and the column 610 represents the token value. Each row in the table 600 represents a particular clock tick and particular input stimulus.

For clock tick 1, the input stimulus is (1, 0, 0) for signals (a, b, c), respectively. In addition, clock tick 1 initiates a new attempt. Using the input stimulus (1, 0, 0) for the clock tick 1, the evaluation engine 204 evaluates the new attempt. Since the signal "a" is true, the model 300 advances to the state S1. Since the assertion did not pass or fail in the new attempt, the new attempt is designated as an active attempt. An active token is formed based on state of the evaluation engine 204. In the present example, an active token may have the form (S1, S2) and thus the active token may be (1, 0). The active token is saved in the FIFO 202.

For clock tick 2, there is no new attempt. Thus, the evaluation engine 204 retrieves the next token from the FIFO 202, which is the token (1, 0) from clock tick 1. Since the both signals "a" and "b" are true, the model 300 transitions to both states S1 and S2. Since the assertion did not pass or fail in this active attempt, the active attempt is updated and its token (1, 1) is stored in the FIFO 202.

At clock tick 3, there is a new attempt. Using the input stimulus (1, 0, 1), the evaluation engine 204 evaluates the new attempt. Since the signal "a" is true, the model 300 advances to the state S1. Since the assertion did not pass or fail in the new attempt, the new attempt is designated as an active attempt. An active token is formed based on state of the evaluation engine 204. In the present example, the active token is (1, 0). The active token is saved in the FIFO 202. In addition, the evaluation engine 204 retrieves the next token from the FIFO 202, which is the token (1, 1) from clock tick 2. Since the signal "c" is true, the model 300 transitions to at least the state "pass". Since the assertion passes in this active attempt, the assertion evaluation engine 114 may generate an indication of that the assertion passed or take some other action based on the assertion passing.

At the clock tick 4, there is a new attempt. Using the input stimulus (1, 1, 1), the evaluation engine 204 evaluates the new attempt. Since both the signals "a" and "b" are true, the model 300 transitions to both the states S1 and S2. Since the assertion did not pass or fail in the new attempt, the new attempt is designated as an active attempt. An active token is formed based on state of the evaluation engine 204. In the present example, the active token is (1, 0). The active token is saved in the FIFO 202. In addition, the evaluation engine 204 retrieves the next token from the FIFO 202, which is the token (1, 0) from clock tick 3. Since the signal "b" is true, the model 300 advances to the state S2. Since the assertion did not pass or fail in this active attempt, the active attempt is updated and its token (1, 1) is stored in the FIFO 202.

At the clock tick 5, there is no new attempt. Thus, the evaluation engine 204 retrieves the next token from the FIFO 202, which is the token (1, 1) from clock tick 4. Since the signal "c" is false, all states in the model 300 are cleared and the assertion fails. Since this active attempt results in failure of the assertion, the assertion evaluation engine 114 may generate an indication of such failure or take some other action based on the failure. The evaluation engine 204 then retrieves the next token from the FIFO 202, which is the token (1, 0) from clock tick 4. Since the signals "a" and "b" are both false, all states in the model 300 are cleared and the assertion fails. Since this active attempt results in failure of the assertion, the assertion evaluation engine 114 may generate an indication of such failure or take some other action based on the failure.

Figure 7:
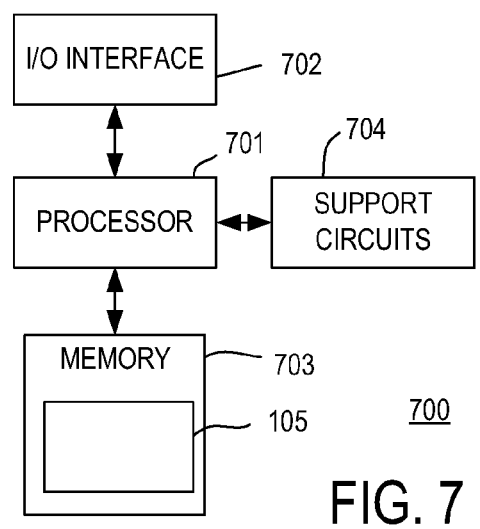
FIG. 7 is a block diagram depicting an exemplary embodiment of a computer system in accordance with one or more aspects of the invention.

FIG. 7 is a block diagram depicting an exemplary embodiment of a computer system 700 in accordance with one or more aspects of the invention. The computer system 700 may be used to implement the workstation 102. The computer system 700 includes a processor 701, a memory 703, various support circuits 704, and an I/O interface 702. The processor 701 may include one or more microprocessors known in the art. The support circuits 704 for the processor 701 include conventional cache, power supplies, clock circuits, data registers, I/O interfaces, and the like. The I/O interface 702 may be directly coupled to the memory 703 or coupled through the processor 701. The I/O interface 702 may also be configured for communication with the hardware accelerator 104.

The memory 703 stores processor-executable instructions and/or data that may be executed by and/or used by the processor 601. These processor-executable instructions may comprise hardware, firmware, software, and the like, or some combination thereof. A module having processor-executable instructions that are stored in the memory 503 may include the verification platform 105. The memory 703 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing is directed to embodiments of the present invention, other and further embodiments of the invention may be devised without departing from the basic scope thereof, and the scope thereof is determined by the claims that follow.

What is claimed is:

1. A method of processing an assertion during verification of a logic design, comprising:

generating an evaluation engine that encodes, using a non-deterministic finite automata (NFA) model, temporal behavior of the logic design required by the assertion for a single attempt to evaluate the assertion;

implementing the evaluation engine in first reconfigurable hardware associated with a hardware accelerator, wherein the hardware accelerator includes an assertion evaluation machine having a hardware implemented first-in-first out (FIFO) configured to receive and transmit data from the evaluation engine;

simulating the logic design over a plurality of clock events; and performing attempts to evaluate the assertion by the evaluation engine sequentially based on input stimuli obtained from the logic design during simulation thereof, each of the attempts resulting in one of the assertion passing, the assertion failing, or the assertion requiring further evaluation, wherein each attempt is stored in the hardware implemented FIFO as a token;

wherein performing includes initiating at least one new attempt to evaluate the assertion by the evaluation engine for at least one of the plurality of clock events;

wherein at each clock event, the at least one new attempt that initiated to evaluate the assertion and all the tokens from previous clock events are processed sequentially by the evaluation engine.

2. The method of claim 1, wherein the act of performing comprises:

storing, in a the hardware implemented (FIFO), information indicative of at least one active attempt that resulted in the assertion requiring further evaluation; and updating the at least one active attempt at the evaluation engine for at least one of the plurality of clock events.

3. The method of claim 2, wherein the act of performing comprises:

initiating a first new attempt to evaluate the assertion by the evaluation engine for a first input stimulus obtained from the logic design from a first clock event, the first new attempt resulting in the assertion requiring further evaluation;

designating the first new attempt as an active attempt to evaluate the assertion;

storing, in the FIFO, an active attempt token derived from state of the evaluation engine after the active attempt; and retrieving the active attempt token from the FIFO at a second clock event;

initializing the state of the evaluation engine based on the active attempt token;

updating the active attempt to evaluate the assertion by the evaluation engine for a second input stimulus obtained from the logic design from the second clock event.

4. The method of claim 1, wherein the temporal behavior of the logic design comprises a temporal sequence of signals of the logic design, wherein the assertion comprises an expression of the temporal sequence, and wherein the input stimuli comprise values of the signals sampled at the plurality of clock events.

5. The method of claim 1, wherein the logic design is implemented in second reconfigurable hardware, the first reconfigurable hardware and the second reconfigurable hardware comprising at least a portion of a hardware accelerator.

6. The method of claim 1, further comprising:

initiating an action responsive to each of the attempts that resulted in at least one of the assertion passing or the assertion failing.

7. A hardware acceleration apparatus for processing an assertion during verification of a logic design, comprising:

an evaluation engine that encodes, using a non-deterministic finite automata (NFA) model, temporal behavior of the logic design required by the assertion for a single attempt to evaluate the assertion; and a first-in-first-out (FIFO) memory implemented in hardware in communication with the evaluation engine, the FIFO memory configured to store information indicative of active attempts to evaluate the assertion by the evaluation engine during simulation of the logic design over a plurality of clock events, wherein each attempt is stored in the FIFO as a token;

wherein the evaluation engine performs initiating at least one new attempt to evaluate the assertion for at least one of the plurality of clock events;

wherein at each clock event, the at least one new attempt initiated to evaluate the assertion and all the tokens from previous clock events are processed sequentially by the evaluation engine.

8. The apparatus of claim 7, wherein the evaluation engine and the FIFO memory are implemented in reconfigurable hardware.

9. The apparatus of claim 7, wherein the evaluation engine is configured to perform attempts to evaluate the assertion sequentially based on input stimuli obtained from the logic design during the simulation thereof, each of the attempts resulting in one of the assertion passing, the assertion failing, or the assertion requiring further evaluation, and wherein the active attempts comprise those of the attempts that resulted in the assertion requiring further evaluation.

10. The apparatus of claim 9, wherein the information stored in the FIFO memory comprises active attempt tokens associated with the active attempts, each of the active attempt tokens being derived from state of the evaluation engine after a respective active attempt to evaluate the assertion.

11. The apparatus of claim 10, wherein the evaluation engine is configured to retrieve active attempt tokens from the FIFO memory and use the active attempt tokens to initialize state.

12. The apparatus of claim 9, wherein the temporal behavior of the logic design comprises a temporal sequence of signals of the logic design, wherein the assertion comprises an expression of the temporal sequence, and wherein the input stimuli comprise values of the signals sampled at the plurality of clock events.

13. The apparatus of claim 9, further comprising:

means for initiating an action responsive to each of the attempts that resulted in at least one of the assertion passing or the assertion failing.

14. The apparatus of claim 7, wherein the logic design is implemented in second reconfigurable hardware, the first reconfigurable hardware and the second reconfigurable hardware comprising at least a portion of a hardware accelerator.

15. A system for verification of a logic design, comprising:

a workstation configured to execute a verification platform that controls simulation of the logic design, the verification platform defining an assertion that represents temporal behavior of the logic design;

a hardware accelerator in communication with the workstation, the hardware accelerator including first reconfigurable hardware for implementing the logic design and second reconfigurable hardware for implementing an assertion evaluation machine, the assertion evaluation machine comprising:

an evaluation engine that encodes, using a non-deterministic finite automata (NFA) model, a single attempt to evaluate the assertion; and a first-in-first-out (FIFO) memory implemented in hardware in communication with the evaluation engine, the FIFO memory configured to store information indicative of active attempts to evaluate the assertion by the evaluation engine during the simulation of the logic design over a plurality of clock events, wherein each attempt is stored in the FIFO as a token;

wherein the evaluation engine performs initiating at least one new attempt to evaluate the assertion for at least one of the plurality of clock events;

wherein at each clock event, the at least one new attempt initiated to evaluate the assertion and all the tokens from previous clock events are processed sequentially by the evaluation engine.

16. The system of claim 15, wherein the first reconfigurable hardware and the second reconfigurable hardware comprise one or more programmable logic devices (PLDs).

17. The system of claim 15, wherein the evaluation engine is configured to perform attempts to evaluate the assertion sequentially based on input stimuli obtained from the logic design during the simulation thereof, each of the attempts resulting in one of the assertion passing, the assertion failing, or the assertion requiring further evaluation, and wherein the active attempts comprise those of the attempts that resulted in the assertion requiring further evaluation.

18. The system of claim 17, wherein the information stored in the FIFO memory comprises active attempt tokens associated with the active attempts, each of the active attempt tokens being derived from state of the evaluation engine after a respective active attempt to evaluate the assertion.

19. The system of claim 18, wherein the evaluation engine is configured to retrieve active attempt tokens from the FIFO memory and use the active attempt tokens to initialize state.

20. The system of claim 15, wherein the temporal behavior of the logic design comprises a temporal sequence of signals of the logic design, wherein the assertion comprises an expression of the temporal sequence, and wherein the input stimuli comprise values of the signals sampled at the plurality of clock events.

* * * * *